United States Patent
Bogner et al.

(10) Patent No.: US 8,994,047 B2
(45) Date of Patent: Mar. 31, 2015

(54) ARRANGEMENT COMPRISING AT LEAST ONE OPTOELECTRONICS SEMICONDUCTOR COMPONENT

(75) Inventors: Georg Bogner, Lappersdorf (DE);
Stefan Gruber, Bad Abbach (DE);
Michael Zitzlsperger, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 1095 days.

(21) Appl. No.: 12/808,165

(22) PCT Filed: Nov. 19, 2008

(86) PCT No.: PCT/DE2008/001911
§ 371 (c)(1),
(2), (4) Date: Oct. 12, 2010

(87) PCT Pub. No.: WO2009/076922
PCT Pub. Date: Jun. 25, 2009

(65) Prior Publication Data
US 2011/0121336 A1 May 26, 2011

(30) Foreign Application Priority Data
Dec. 14, 2007 (DE) .......................... 10 2007 060 206

(51) Int. Cl.
*H01L 33/00* (2010.01)
*H01L 33/48* (2010.01)
*H01L 33/44* (2010.01)
*H01L 25/075* (2006.01)

(52) U.S. Cl.
CPC .............. *H01L 33/486* (2013.01); *H01L 33/44* (2013.01); *H01L 25/0753* (2013.01); *H01L 2224/48091* (2013.01); *H01L 2224/48464* (2013.01)

USPC .................................... 257/98; 257/E33.067

(58) Field of Classification Search
USPC .............................................. 257/98, E33.067
See application file for complete search history.

(56) References Cited

U.S. PATENT DOCUMENTS

| | | | |
|---|---|---|---|
| 5,581,076 A * | 12/1996 | Tabata | 250/208.1 |
| 6,900,511 B2 | 5/2005 | Ruhnau et al. | |
| 2002/0039001 A1 | 4/2002 | Nagai et al. | |
| 2004/0037076 A1 | 2/2004 | Katoh et al. | |
| 2004/0201987 A1 | 10/2004 | Omata | |
| 2004/0256706 A1 | 12/2004 | Nakashima | |
| 2006/0006793 A1 | 1/2006 | Baroky et al. | |
| 2006/0234409 A1 | 10/2006 | Nagai et al. | |
| 2007/0194422 A1 | 8/2007 | Lai et al. | |
| 2008/0038853 A1* | 2/2008 | Park et al. | 438/26 |

(Continued)

FOREIGN PATENT DOCUMENTS

| | | |
|---|---|---|
| CN | 101030572 A | 9/2007 |
| DE | 102 29 067 | 1/2004 |

(Continued)

*Primary Examiner* — Marvin Payen
(74) *Attorney, Agent, or Firm* — Cozen O'Connor (57) ABSTRACT

An arrangement having at least one optoelectronic semiconductor component includes a carrier element suitable for carrying the at least one optoelectronic semiconductor component. The arrangement comprises a housing body formed from a light-absorbing plastic. The housing body is arranged at the carrier element The housing body comprises an elevated region and a recessed region. An oblique flank is formed between the elevated and recessed regions. The recessed region reaches as far as the optoelectronic semiconductor component in order to reduce reflections.

21 Claims, 4 Drawing Sheets

(56) References Cited

U.S. PATENT DOCUMENTS

| | | | |
|---|---|---|---|
| 2008/0265266 A1* | 10/2008 | Bogner et al. | 257/98 |
| 2009/0212316 A1 | 8/2009 | Braunne et al. | |
| 2009/0236625 A1* | 9/2009 | Yen et al. | 257/99 |
| 2009/0261365 A1 | 10/2009 | Brunner et al. | |
| 2009/0267107 A1* | 10/2009 | Weber-Rabsilber et al. | 257/99 |

FOREIGN PATENT DOCUMENTS

| | | |
|---|---|---|
| DE | 10 2004 045 950 | 3/2006 |
| DE | 10 2005 041 064 | 3/2007 |
| DE | 10 2006 004 397 | 4/2007 |
| JP | 5-50754 | 7/1993 |
| JP | 08-287719 | 11/1996 |
| JP | 09-083018 | 3/1997 |
| JP | 10-284759 | 10/1998 |
| JP | 2002/223005 | 8/2002 |
| JP | 2002-232014 | 8/2002 |
| JP | 2003-086846 | 3/2003 |
| JP | 2001-210840 | 8/2003 |
| JP | 2005-512331 | 4/2005 |
| JP | 2005-217094 | 8/2005 |
| JP | 2006-216887 | 8/2006 |
| JP | 2007-227882 | 9/2007 |
| JP | 2007-324330 | 12/2013 |
| KR | 10-2007-0000638 | 1/2007 |
| WO | WO 2006/032251 | 3/2006 |
| WO | WO2006032251 A1 * | 3/2006 |
| WO | WO 2008/074286 | 6/2008 |
| WO | WO2008074286 A1 * | 6/2008 |
| WO | WO 2008/083672 | 7/2008 |

* cited by examiner

ARRANGEMENT COMPRISING AT LEAST ONE OPTOELECTRONICS SEMICONDUCTOR COMPONENT

RELATED APPLICATION

This is a U.S. National Phase Application under 35 USC §371 of International Application PCT/DE2008/001911 filed on Nov. 19, 2008.

This patent application claims the priority of German Patent Application No. 10 2007 060 206.7 filed Dec. 14, 2007, the disclosure content of which is hereby incorporated by reference.

FIELD OF THE INVENTION

The invention relates to an arrangement having at least one optoelectronic semiconductor component. reference in the present patent application.

BACKGROUND OF THE INVENTION

A multiplicity of different housings are used for electronic components. Semiconductor components are in many cases mounted on structured metallic carrier elements and enclosed in a potting compound by injection moulding. If radiation impinges on the housing externally, reflections can occur at housing parts, the carrier elements or at electronic components. In the case of optoelectronic semiconductor components to which no voltage is applied, this can give rise to the impression that they are emitting radiation.

SUMMARY OF THE INVENTION

It is an object of the invention to specify an arrangement having at least one optoelectronic semiconductor component, which arrangement is better protected against undesired reflections.

One aspect of the present invention is directed to an arrangement having at least one optoelectronic semiconductor component has a carrier element arrangement suitable for carrying the at least one optoelectronic semiconductor component. The optoelectronic semiconductor component can be a radiation-emitting semiconductor component. The carrier element arrangement has a surface which has at least one connection area. The optoelectronic semiconductor component is coupled to the connection area. The arrangement furthermore has a housing body formed from a plastic, said housing body being arranged at the carrier element arrangement. The housing body has an elevated region and a recessed region. An oblique flank is formed between the elevated and recessed regions. The recessed region reaches as far as the optoelectronic semiconductor component. The plastic is light-absorbing, for example black.

In particular, the elevated region and the recessed region of the housing body are preferably in each case at least partly arranged on the carrier element arrangement. Particularly preferably, the recessed region covers a large part, for example 60% or more, preferentially 70% or more, preferably 80% or more, particularly preferably 90% or more, of a surface of the carrier element arrangement that faces the semiconductor component. The recessed region thus extends on the surface of the carrier element arrangement that faces the semiconductor component in a lateral direction over the carrier element arrangement. Preferably, no housing body, in particular no recessed region of the housing body, is arranged on the carrier element arrangement at a mounting region of the semiconductor component.

Preferably, a surface of the recessed region that is remote from the carrier element arrangement and the connection area are not arranged flush with respect to one another. In particular, the recessed region projects beyond the connection area in a vertical direction. The recessed region can at least partly extend along the semiconductor component and away from the carrier element.

The recessed region reaches as far as the optoelectronic semiconductor component. Preferably, the recessed region reaches directly as far as the optoelectronic semiconductor component. In this case, the recessed region can extend directly along the semiconductor component. In particular, side areas of the recessed region are then in direct contact with side areas of the semiconductor component. Preferably, all the side areas of the recessed region are in direct contact with the side areas of the semiconductor component.

Furthermore, it is possible for only regions of the side areas of the recessed region to be arranged directly at side areas of the optoelectronic semiconductor component. The side area of the recessed region and the side area of the optoelectronic semiconductor component are then in direct contact only in regions. By way of example, the side areas of the recessed region are formed obliquely towards the carrier element arrangement, such that only regions of the recessed region that are arranged directly at the carrier element arrangement are in direct contact with the side areas of the semiconductor component.

As an alternative, a distance can be arranged between the recessed region and the optoelectronic semiconductor component. Preferably, the distance between the recessed region and the optoelectronic semiconductor component is 500 μm or less, for example 300 μm or less, preferably 200 μm or less, particularly preferably 100 μm or less. The recessed region can be spaced apart from the semiconductor component just in regions or circumferentially.

The connection area of the carrier element arrangement to which the optoelectronic semiconductor component is coupled is preferably an electrical connection area for the optoelectronic semiconductor component. In particular, the optoelectronic semiconductor component is electrically conductively connected to the connection area, for example by means of a conductive adhesive or an electrically conductive solder.

In one embodiment, the elevated region of the housing body has a height and a width that enable an angle of emergence of 140° or greater.

Further electronic components can be arranged within the housing body, for example in a manner coupled to the carrier element and surrounded by the plastic material of the housing body. In this case, the surface of the carrier element arrangement preferably has further connection areas which are in each case coupled, in particular electrically conductively connected, to a further electronic component.

In a further embodiment, the carrier element arrangement comprises a conductive material, in particular a conductive metal, for example copper. The carrier element arrangement can be formed from at least two, expediently electrically conductive, parts that are electrically insulated from one another.

A formation of the housing body is preferably arranged between the at least two parts of the carrier element arrangement. Preferably, the formation of the housing body between the at least two parts of the carrier element arrangement, on the surface remote from the semiconductor component, terminates with the surface of the carrier element arrangement that is remote from the semiconductor component. In particular, the formation of the housing body does not project beyond the carrier element arrangement in a vertical direction on an underside of the arrangement, such that the underside of the arrangement is formed in planar fashion and has in particular no elevations. The underside of the arrangement thus has a plane bearing area by which the arrangement can be mounted externally, for example on a printed circuit board.

In one embodiment, the connection area on the surface of the carrier element arrangement comprises the centre of the carrier element arrangement.

In a further embodiment, the arrangement comprises a bonding wire that is coupled to a further connection area and forms an electrical connection for the optoelectronic semiconductor component. In this embodiment, the recessed region of the housing body reaches as far as the connection area of the bonding wire.

The arrangement can comprise a light-transmissive covering, which is arranged at the at least one elevated region and covers the optoelectronic semiconductor component. The covering can comprise an absorber material in order to reduce a reflection of light impinging from outside the arrangement. Preferably, the absorber material in this case absorbs virtually no radiation emitted by the semiconductor component. In particular, the absorber material absorbs 50% or less, preferably 30% or less, particularly preferably 10% or less, of the radiation emitted by the semiconductor component.

For the same purpose, the light-transmissive covering can have a structured surface.

In a further embodiment, the arrangement comprises a light-transmissive optical assembly, for example a lens, which is arranged at the at least one elevated region and covers the at least one semiconductor component.

The at least one elevated region surrounds an opening in which a light-transmissive filling material can be arranged. The filling material can comprise a diffuser material in order to diffuse the light emitted by the optoelectronic semiconductor component. The filling material can comprise an absorber material in order to reduce a reflection of light impinging from outside the arrangement. The absorber material contains carbon black or graphite, for example. Preferably, the absorber material in this case absorbs virtually no radiation emitted by the semiconductor component. In particular, the absorber material absorbs 50% or less, preferably 30% or less, particularly preferably 10% or less, of the radiation emitted by the semiconductor component.

Preferably, the optoelectronic semiconductor component is a light-emitting diode (LED), in particular an LED chip.

DETAILED DESCRIPTION OF THE DRAWINGS

Figure 1:
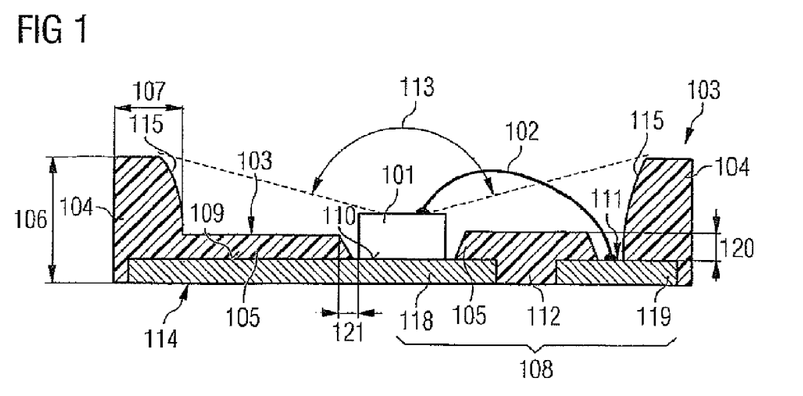
FIG. 1 shows a schematic illustration of an arrangement in accordance with one embodiment.

FIG. 1 shows an optoelectronic semiconductor component 101, a bonding wire 102, a housing body 103, and a carrier element arrangement 108. The housing body has an elevated region 104 and a recessed region 105 and also a flank 115 between the two regions. The carrier element arrangement has a surface 109 having a connection area 110 and a further connection area 111.

In particular, the elevated region 104 and the recessed region 105 of the housing body 103 are preferably in each case at least partly arranged on the carrier element arrangement 108. Preferably, a surface of the recessed region that is remote from the carrier element arrangement, and the connection areas are not arranged flush with respect to one another. In particular, the recessed region projects beyond the connection areas in a vertical direction.

In the embodiment shown, the carrier element arrangement comprises a first part 118 and a second part 119, which are electrically insulated from one another by a formation 112 of the housing body.

Preferably, the formation 112 of the housing body 103 is arranged between the at least two parts 118, 119 of the carrier element arrangement 108. Preferably, the formation of the housing body between the at least two parts of the carrier element arrangement, on the surface remote from the semiconductor component, terminates with the surface of the carrier element arrangement that is remote from the semiconductor component. In particular, the formation of the housing body does not project beyond the carrier element arrangement in a vertical direction on an underside of the arrangement, such that the underside of the arrangement is formed in planar fashion and has in particular no elevations. The underside of the arrangement thus has a plane bearing area by which the arrangement can be mounted externally, for example on a printed circuit board.

The optoelectronic semiconductor component is arranged on the connection area 110 and can be supplied with a voltage via the latter. The bonding wire is connected to the further connection area 111 and enables a voltage to be applied to the optoelectronic semiconductor component.

Preferably, the optoelectronic semiconductor component is a light-emitting diode (LED), in particular an LED chip.

The carrier element can be formed from a conductive material, for example a metal, in order to enable electrical contact to be made with the optoelectronic semiconductor component. The carrier element can be a structured metal layer, for example formed from copper, which is divided into separate portions that are electrically insulated from one another. Electrical contact can be made with the optoelectronic component via contact areas on the underside 114 of the carrier element arrangement. The carrier element arrangement thus forms an external electrical connection at the housing. In this embodiment, the housing need not be provided with strip-type connection conductors led towards the outside. The contact areas on the underside of the carrier element arrangement can be soldered onto a circuit board, for example, for an external electrical connection.

The housing body is produced from a material that reflects as little light as possible. The housing body is formed from black plastic, for example. The housing body can be formed from a plurality of parts that are arranged at the carrier element arrangement. The elevated region of the housing body has a height 106 and a width 107. Said height and width lie in ranges that enable a wide angle 113 of emergence of the radiation emitted by the optoelectronic semiconductor component. The angle of emergence can lie in a range of 130° to 170°, and can be 160° for example. The height 106 lies for example in a range of 100 μm to 300 μm. Receivers of the emitted radiation are intended to be able to receive the emitted radiation in a largest possible range.

The recessed region of the housing body covers as much area as possible of the surface of the carrier element arrangement. Preferably, the recessed region covers a large part, for example 60% or more, preferentially 70% or more, preferably 80% or more, particularly preferably 90% or more, of the surface of the carrier element arrangement that faces the semiconductor component. It is directed from the flank of the housing body as far as the optoelectronic semiconductor component or the connection area of the bonding wire. The recessed region thus extends on that surface of the carrier element arrangement which faces the semiconductor component in a lateral direction over the carrier element arrangement.

The recessed region can be spaced apart from the semiconductor component just in regions or circumferentially.

Preferably, no housing body, in particular no recessed region of the housing body, is arranged on the carrier element arrangement at a mounting region of the semiconductor component.

The recessed region has for example a height 120 in a range of 50 μm to 200 μm. A distance 121 between the recessed region and the optoelectronic semiconductor component is for example 50 μm or more; the distance lies for example in a range of 150 μm to 200 μm.

As an alternative, the recessed region can reach directly as far as the optoelectronic semiconductor component. In this case, the recessed region can extend directly along the semiconductor component. Furthermore, it is possible for only regions of the side areas of the recessed region to be arranged directly at side areas of the optoelectronic semiconductor component. By way of example, the side areas of the recessed region are formed obliquely towards the carrier element arrangement, such that only regions of the recessed region that are arranged directly at the carrier element arrangement are in direct contact with the side areas of the semiconductor component.

Figure 3:
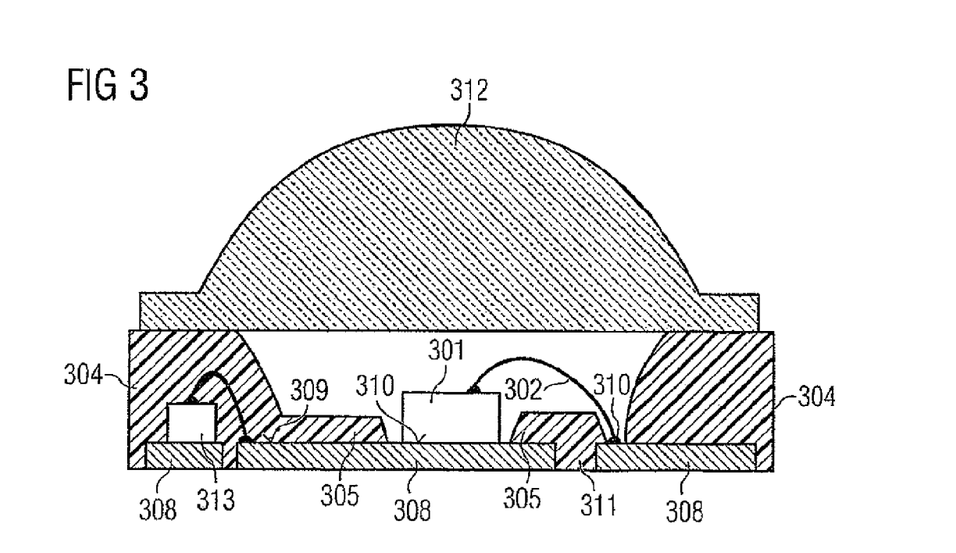
FIG. 3 shows a schematic illustration of an arrangement in accordance with a further embodiment with a lens.

As illustrated in FIG. 3, an additional electronic component, for example a circuit affording protection against damage by electrostatic charging, can be contained in a manner surrounded by the housing body and arranged on the carrier element arrangement. In this case, the height 106 can lie in a range of 200 μm to 300 μm; it can also be up to 2 mm. Heat arising in these additional electronic components can be dissipated well by the black housing body. The housing body furthermore has a low coefficient of thermal expansion. The reliability of the further electronic components can thereby be increased.

The connection areas of the carrier element arrangement are preferably electrical connection areas for the optoelectronic semiconductor component and the electronic component. In particular, the optoelectronic semiconductor component and the electronic component are in each case electrically conductively connected to a connection area, for example by means of a conductive adhesive or an electrically conductive solder.

Figure 2:
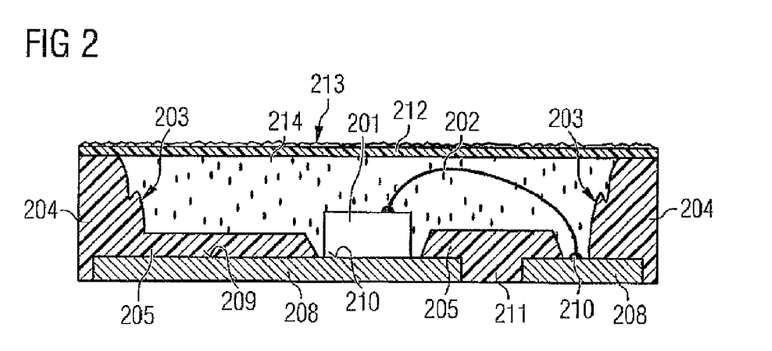
FIG. 2 shows a schematic illustration of an arrangement in accordance with a further embodiment with a light-transmissive covering.

FIG. 2 shows an optoelectronic semiconductor component 201, a bonding wire 202, a housing body 203 and a carrier element arrangement 208. The housing body has an elevated region 204 and a recessed region 205. The carrier element arrangement has a surface 209 comprising connection areas 210. A covering 212 having a surface 213 is furthermore shown. The arrangement comprises a filling material 214.

The optoelectronic semiconductor component is coupled to the connection area of the carrier element arrangement and can be supplied with voltage via the connection area and also via the bonding wire. A formation 211 of the housing body separates the carrier element arrangement into two parts and electrically insulates them from one another. In order to cover as many regions of the carrier element arrangement as possible, the recessed region of the housing body is taken as near as possible to the optoelectronic semiconductor component.

In order that reflections which can occur at the bonding wire, for example, are prevented to the greatest possible extent, the covering can contain absorber material, for example carbon black, graphite or black pigments.

Preferably, the absorber material in this case absorbs virtually no radiation emitted by the semiconductor component. In particular, the absorber material absorbs 50% or less, preferably 30% or less, particularly preferably 10% or less, of the radiation emitted by the semiconductor component.

In addition, the covering can contain a structured surface for reducing reflections further. The covering can be fixed on the elevated region of the housing body in a simple manner, for example by an adhesive-bonding connection.

A transparent filling material can be arranged in an opening surrounded by the elevated region of the housing body. The filling material is filled for example to the level of the elevated region on the recessed region and the optoelectronic semiconductor component. The filling material can be higher than the elevated region. By way of example, the filling material can project beyond the elevated region by 50 to 500 μm. In this exemplary embodiment, the covering is arranged on the filling material.

The filling material can be enriched with an absorber material, for example carbon black or graphite, in order to reduce reflections further. The filling material can have for example a proportion of 0.1% of absorber material, but it can also have a lower concentration of less than 0.1%, between 0% and 0.1%. Disturbing scattered light and light reflections can thus be reduced. Scattered light and light reflections can be caused for example by the carrier element arrangement, electrical connections or further components of the arrangement.

In order to achieve a widest possible coupling-out of light, the filling material can be enriched with a diffuser material. The diffuser material can have for example a concentration of 10% of the filling material, but the concentration can also lie in a range of 0% to 10%. The diffuser material diffuses the radiation emitted by the optoelectronic semiconductor component. The area of the arrangement from which light emerges can thus be enlarged. For better adhesion of the filling material in the arrangement, cutouts can be provided in the housing body.

FIG. 3 shows an optoelectronic semiconductor component 301, a bonding wire 302, an elevated region 304 and a recessed region 305 of the housing body, and a carrier element arrangement 308. The carrier element arrangement has a surface 309 comprising connection areas 310. The housing body has formations 311 which in this embodiment are fitted for delimiting the portions of the carrier element arrangement. The bonding wire is coupled by one end to the optoelectronic component and by the other end to a connection area of the carrier element arrangement.

The exemplary embodiment shows an electrical component 313, for example a protective diode, a driver component or a resistor, which is arranged on the carrier element arrangement. The electrical component can be supplied with voltage via the carrier element arrangement. The formation 311 can separate the carrier element arrangement into parts that are electrically insulated from one another. A voltage can be applied to the electrical component from outside the arrangement via the carrier element arrangement.

The electrical component can be completely surrounded by the housing body. A plurality of such electrical components can be arranged within the housing body. By virtue of the arrangement of the additional electronic components within the housing body, no reflections can occur at the electronic components.

The figure shows a lens 312 arranged at the elevated region of the housing body. Any desired optical assembly can be arranged instead of the lens. The optical assembly can be fixed on the elevated region of the housing body by means of an adhesive-bonding connection, for example.

The lens can be used for example to set the angle of emergence of the light emitted by the optoelectronic semiconductor component to a desired range. In one embodiment, the angle of emergence lies in a range of below 40°; it can lie for example in a range of 20° to 30°. In principle, virtually any desired angle of emergence can be defined by means of a corresponding optical assembly.

Figure 4:
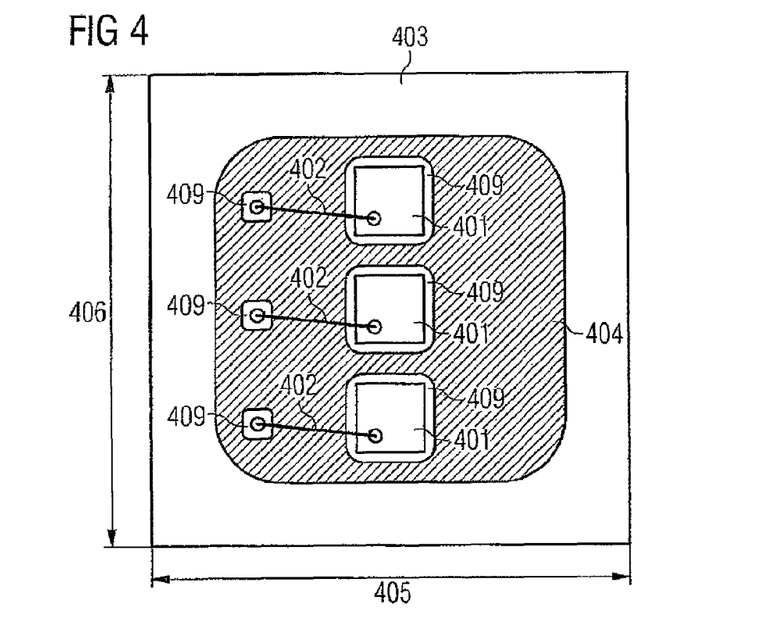
FIG. 4 shows a schematic plan view of an arrangement in accordance with a further embodiment with three optoelectronic semiconductor components.

FIG. 4 shows three optoelectronic semiconductor components 401 with respective bonding wires 402. An elevated region 403 and a recessed region 404 of the housing body are furthermore shown. Both the optoelectronic semiconductor components and the bonding wires are contact-connected to respective connection areas 409. The housing body has a side length 405 and a further side length 406.

The connection areas are at least as large as the optoelectronic semiconductor components plus a mounting tolerance or at least as large as the contact-connection of the bonding wire plus a mounting tolerance. The optoelectronic semiconductor components can have for example an edge length of 0.2 mm; the mounting tolerance can lie in a range of between 10 µm and 100 µm.

In the exemplary embodiment shown, the three optoelectronic semiconductor components are arranged in a row. However, they can also be arranged in a different arrangement, for example in triangular or rhomboidal fashion. The optoelectronic semiconductor components are arranged for example symmetrically about the centre of the arrangement.

The respective optoelectronic semiconductor components can emit radiation in different wavelength ranges. By way of example, one optoelectronic semiconductor component emits radiation in the green colour range, a further optoelectronic semiconductor component emits radiation in the blue colour range and a further optoelectronic semiconductor component emits radiation in the red colour range. A spectrum of the resulting overall radiation can thus be formed from different added spectral ranges. The housing size, in particular the dimensions of the side length 405 and the side length 406, can be dimensioned in accordance with a desired size. By way of example, the side lengths are 6 mm long, but they can also be shorter, for example 2 mm, or lie in a range of 3 mm to 5 mm.

If a plurality of the arrangements shown are arranged adjacent to one another, then the respective side lengths can be adapted to a desired distance between the optoelectronic components of the respective arrangements. If a distance of 5 mm, for example, is desired, the side length 405 and the side length 406 are in each case 5 mm, in each case minus a mounting tolerance, lying for example in a range of between 20 and 100 µm. For other desired distances between the optoelectronic semiconductor components, the side lengths can be defined accordingly.

Figure 5:
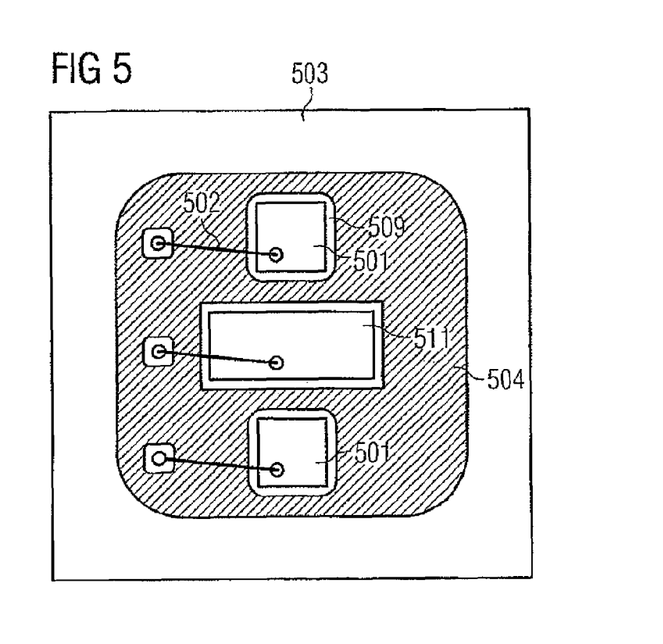
FIG. 5 shows a schematic plan view of an arrangement in accordance with a further embodiment with three optoelectronic semiconductor components wherein one optoelectronic semiconductor component is larger than the other optoelectronic semiconductor components.

FIG. 5 shows optoelectronic semiconductor components 501 with respective bonding wires 502, a further optoelectronic semiconductor component 511, an elevated region 503 and a recessed region 504 of the housing body, and connection areas 509.

The optoelectronic semiconductor components and the bonding wires are coupled to the connection areas. They are surrounded by the recessed region of the housing body, which is adjacent to the elevated region of the housing body towards the outside. The optoelectronic component 511 has larger dimensions than the optoelectronic semiconductor components 501. Instead of one larger semiconductor component, it is also possible to use two or more optoelectronic semiconductor components that emit in an identical wavelength range. As a result, it is possible to amplify desired emission ranges, lying in the red colour range, for example, in the total emission spectrum of the arrangement. Different ranges can be emphasized to different extents in the emission spectrum.

Figure 6:
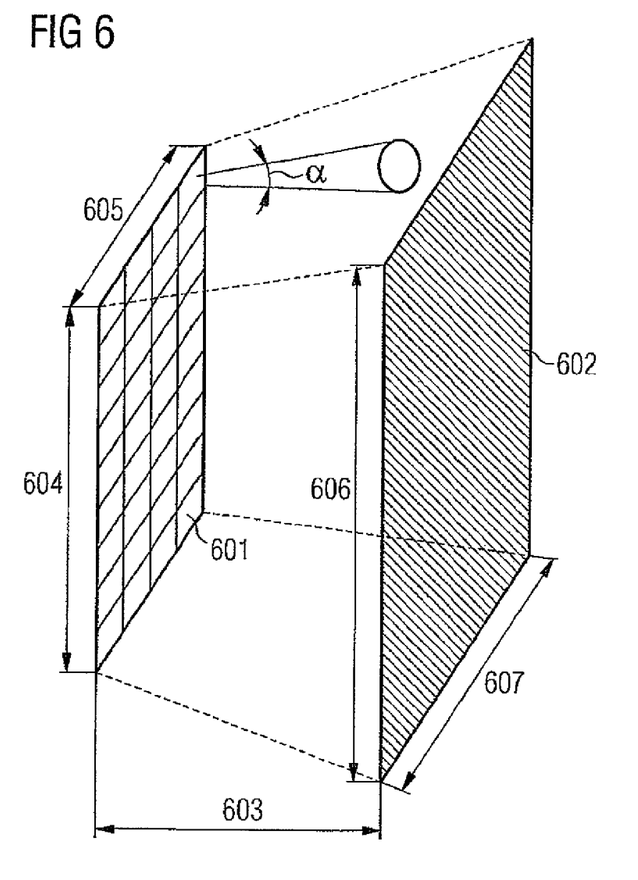
FIG. 6 shows a schematic illustration of an exemplary application wherein an array of optoelectronic semiconductor components provides illumination for a display.

FIG. 6 shows an array of arrangements 601 according to the invention, having a first side length 604 and a second side length 605, and also a display 602 having a side length 606 and a further side length 607, which is arranged at a distance 603 from the array. The arrangements comprise semiconductor components suitable for emitting radiation when a supply voltage is applied. In this embodiment, they constitute a backlighting of a liquid crystal display, for example.

The arrangements are combined for example in a matrix arrangement. For this purpose, firstly the size of the respective housing bodies of the semiconductor components can be adapted to a desired size, for example depending on a desired distance between the respective semiconductor components. The desired distance can be 5 mm, for example. An array having a desired number of individual arrangements can be separated from an array having a larger number of arrangements.

For a display having a first side length 606 of 36 mm and a second side length 607 of 18 mm, it is possible to use for example a semiconductor array having 4×8 arrangements. The minimum size of the array of arrangements (side lengths 604 and 605) can be calculated depending on the size of the display (side lengths 606 and 607) and the distance 603 between display and array, for example, approximately by means of the following formulae, where a corresponds to an angle of emergence of the emitted radiation of an arrangement:

$$l_{604} = l_{606} - 2 * l_{603} * \tan(\alpha/2) \quad (1)$$

$$l_{605} = l_{607} - 2 * l_{603} * \tan(\alpha/2) \quad (2)$$

The arrangements can each contain a single optoelectronic semiconductor component; however, they can also comprise a plurality of optoelectronic semiconductor components, as shown in FIG. 4, for example. An optical assembly can be arranged at the respective housing bodies, in the manner shown in FIG. 3. The optical assembly is a lens, for example, which enables an emission angle of between 10° and 30°.

The size of the array of semiconductor components can be configured such that the entire luminous area of the array at the distance 603 illuminates the display as homogeneously as possible. For this purpose, by means of the lens it is possible to appropriately set the emission angles and by means of the structural size of the housing bodies it is possible to appropriately set the distances between the respective semiconductor components of the arrangements among one another. A use of arrangements according to the invention for illuminating the display enables a high contrast between illuminated and dark regions on the display.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An arrangement comprising:
   at least one optoelectronic semiconductor component;
   a carrier element having a surface with at least one connection area coupled to said at least one optoelectronic semiconductor component; and
   a housing body comprising a light-absorbing plastic, said housing body being supported by said carrier element and having at least one elevated region, at least one recessed region and an oblique flank between said at least one elevated region and said at least one recessed region,
   wherein the arrangement includes at least one of (i) a distance of 500 micrometer (μm) or less arranged between said at least one recessed region and said at least one optoelectronic semiconductor component, and (ii) said at least one recessed region reaches directly as far as said at least one optoelectronic semiconductor component.

2. The arrangement of claim 1, wherein said housing body further comprises at least two separate parts supported by said carrier element.

3. The arrangement of claim 1, wherein said light-absorbing plastic is black.

4. The arrangement of claim 1, wherein said at least one elevated region has a height and a width that enable an angle of emergence of the light emitted by said at least one optoelectronic semiconductor component of 140° or greater.

5. The arrangement of claim 1, further comprising a bonding wire and at least one further connection area,
   wherein said bonding wire forms an electrical connection between said at least one optoelectronic semiconductor component and said at least one further connection area, and
   wherein said at least one recessed region of said housing body reaches as far as said at least one further connection area.

6. The arrangement of claim 1, wherein said at least one electronic component is completely surrounded by said housing body.

7. The arrangement of claim 1, further comprising a light-transmissive covering, at said at least one elevated region, to cover said at least one optoelectronic semiconductor component.

8. The arrangement of claim 7, wherein said light-transmissive covering comprises an absorber material to reduce reflection of light impinging from outside the arrangement.

9. The arrangement of claim 7, wherein said light-transmissive covering has a surface configured to reduce reflection of light impinging from outside the arrangement.

10. The arrangement of claim 1, further comprising a light-transmissive optical assembly, at said at least one elevated region, said light-transmissive optical assembly covering said at least one semiconductor component.

11. The arrangement of claim 1, further comprising a light-transmissive filling material, in an opening surrounded by said at least one elevated region, said light-transmissive filling material surrounding said at least one semiconductor component.

12. The arrangement of claim 11, wherein said light-transmissive filling material comprises a diffuser material to diffuse the light emitted by said at least one optoelectronic semiconductor component.

13. The arrangement of claim 11, wherein said light-transmissive filling material comprises an absorber material to reduce reflection of light impinging from outside the arrangement.

14. The arrangement of claim 13, wherein said absorber material comprises at least one of carbon black and graphite.

15. The arrangement of claim 1, defining:
    a first plane for placing said arrangement onto an area;
    a second plane, spaced apart from said first plane, wherein said at least one connection area lies on said second plane and wherein said at least one optoelectronic semiconductor component is arranged on said second plane:
    a third plane, spaced apart further from said first plane than said second plane, said third plane determining a top side of said at least one recessed region of said housing body; and
    a fourth plane, spaced apart further from said first plane than said third plane, said fourth plane reaching said at least one elevated region of said housing body.

16. The arrangement of claim 10, wherein said light-transmissive optical assembly comprises a lens.

17. The arrangement of claim 1, wherein said at least one recessed region is spaced apart from said at least one optoelectronic semiconductor component just in regions or circumferentially.

18. An arrangement comprising:
    at least one optoelectronic semiconductor component;
    a carrier element having a surface with at least one connection area coupled to said at least one optoelectronic semiconductor component; and
    a housing body comprising a light-absorbing plastic, said housing body being supported by said carrier element and having at least one elevated region, at least one recessed region and an oblique flank between said at least one elevated region and said at least one recessed region,
    wherein the height of the recessed region is less than the height of the elevated region, the height of the elevated region lies in the range of 100 micrometer (μm) to 2 mm, and the height of the recessed region lies in the range of 50 micrometer (μm) to 200 micrometer (μm).

19. The arrangement of claim 18, wherein an underside of the arrangement has a plane bearing area for external mounting of the arrangement.

20. The arrangement of claim 18, wherein the height of the recessed region is less than the height of the semiconductor component.

21. An arrangement comprising:
    at least one optoelectronic semiconductor component;
    a carrier element having a surface with at least one connection area coupled to said at least one optoelectronic semiconductor component; and
    a housing body comprising a light-absorbing plastic, said housing body being supported by said carrier element and having at least one elevated region, at least one recessed region and an oblique flank between said at least one elevated region and said at least one recessed region,
    wherein the arrangement includes at least one of (i) a distance of 500 micrometer (μm) or less arranged between said at least one recessed region and said at least one optoelectronic semiconductor component, and (ii)

said at least one recessed region reaches directly as far as said at least one optoelectronic semiconductor component, wherein the height of the recessed region is less than the height of the elevated region, the height of the elevated region lies in the range of 100 micrometer (μm) to 2 mm, and the height of the recessed region lies in the range of 50 micrometer (μm) to 200 micrometer (μm), and wherein the arrangement defines:

a first plane for placing said arrangement onto an area;

a second plane, spaced apart from said first plane, wherein said at least one connection area lies on said second plane, and said at least one optoelectronic semiconductor component is arranged on said second plane:

a third plane, spaced apart further from said first plane than said second plane, said third plane determining a top side of said at least one recessed region of said housing body; and a fourth plane, spaced apart further from said first plane than said third plane, said fourth plane reaching said at least one elevated region of said housing body.

\* \* \* \* \*